(12) United States Patent
Ju et al.

(10) Patent No.: US 7,391,152 B2
(45) Date of Patent: Jun. 24, 2008

(54) INORGANIC THIN LAYER, ORGANIC ELECTROLUMINESCENCE DEVICE INCLUDING THE SAME, AND FABRICATION METHOD THEREOF

(75) Inventors: Byeong-Kwon Ju, Seoul (KR); Jai-Kyeong Kim, Seoul (KR); Young-Chul Kim, Seoul (KR); Hoon Kim, Seoul (KR); Kwang-Ho Kim, Seoul (KR); Joo-Won Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 562 days.

(21) Appl. No.: 10/922,931

(22) Filed: Aug. 23, 2004

(65) Prior Publication Data

US 2005/0046339 A1     Mar. 3, 2005

(30) Foreign Application Priority Data

Aug. 28, 2003   (KR) .................... 10-2003-0059905

(51) Int. Cl.
*H01J 1/62* (2006.01)

(52) U.S. Cl. ....................................... 313/506; 313/509
(58) Field of Classification Search ......... 313/498–503, 313/506, 509
See application file for complete search history.

(56) References Cited

U.S. PATENT DOCUMENTS 5,650,370 A * 7/1997 Tennent et al. .............. 502/174

FOREIGN PATENT DOCUMENTS

| JP | 2001-338754 | 12/2001 |
|----|-------------|---------|
| JP | 2002-117973 | 4/2002  |

* cited by examiner

*Primary Examiner*—Vip Patel
(74) *Attorney, Agent, or Firm*—Dickstein Shapiro LLP

(57) ABSTRACT

The present invention discloses an inorganic thin layer which is composed of an inorganic composite containing at least two kinds of inorganic materials and shows excellent moisture and oxygen proof, an organic electroluminescence device including the inorganic thin layer as a passivation layer, and a fabrication method thereof.

9 Claims, 8 Drawing Sheets

INORGANIC THIN LAYER, ORGANIC ELECTROLUMINESCENCE DEVICE INCLUDING THE SAME, AND FABRICATION METHOD THEREOF

BACKGROUND OF THE INVENTION

1. Field of the Invention

The present invention relates to an inorganic thin film layer which is composed of an inorganic composite containing at least two kinds of inorganic materials and shows excellent moisture and oxygen barriers, an organic electroluminescence device including the inorganic thin layer as a passivation layer, and a fabrication method thereof.

2. Description of the Background Art

An Organic Light-emitting Diodes (OLEDs) are a self light emitting type, not a light receiving type like a thin film transistor-liquid crystal display (TFT-LCD). The OLED is advantageous in a response time, power consumption and brightness. Therefore, the OLED has been considered as a flat panel display replacing a liquid crystal display (LCD). The OLED is classified into a transparent OLED (TOLED), a flexible OLED (FOLED), a stacked OLED (SOLED), and a microcavity OLED (MOLED) according to functions, and into a passive mode OLED (PM-OLED) and an active mode OLED (AM-OLED) according to driving types.

A general fabrication method of the OLED will now be explained. An anode electrode is deposited on a glass or plastic substrate, and electrode patterns are formed thereon. An organic layer comprised of a hole injection layer, a hole transfer layer, a light emitting layer and an electron transfer layer is formed on the patterned electrode. A metal electrode which is a cathode electrode is deposited on the organic layer.

In order to prevent degradation and non-emissive dark spot of the organic layer by moisture or oxygen, a passivation layer has been suggested to be formed on the surface of the OLED. Exemplary methods for forming the passivation layer include a method for encapsulating a device with a metal can, and a method for spin-coating organic polymer materials. However, the encapsulation method is very complicated and not applied to a large area and flexible display.

In addition, deposition of $SiO_2$ and $Si_xN_y$ was developed to form the passivation layer. However, a process for depositing $SiO_2$ and $Si_xN_y$ requires a high temperature, and thus due to crystallization of the organic layers of the OLED. In the case that an inorganic thin layer such as $SiO_2$ and MgO is formed by using a general vacuum evaporator, it is difficult to completely implement physical properties of the material itself. Accordingly, even though the inorganic thin layer is formed as the passivation layer of the OLED, it is not efficiently operated due to a high oxygen transmission rate (OTR) and a high water vapor transmission rate (WVTR).

SUMMARY OF THE INVENTION

Therefore, an object of the present invention is to provide an inorganic thin layer which is composed of an inorganic composite containing at least two kinds of inorganic materials at a predetermined ratio and shows excellent moisture and oxygen proof.

Another object of the present invention is to provide an organic electroluminescence device which has high performance and stability, by using the inorganic thin layer as a passivation layer.

Yet another object of the present invention is to provide a fabrication method of the organic electroluminescence device.

To achieve these and other advantages and in accordance with the purpose of the present invention, as embodied and broadly described herein, there are provided an inorganic mono-layer and an inorganic multi-layer that can be used as a passivation layer of an organic electroluminescence device, an organic electroluminescence device including the same, and a fabrication method thereof.

In accordance with the present invention, for example, when an inorganic thin layer is formed by using $SiO_2$ and MgO as base materials and mixing and depositing the other inorganic materials, an oxygen transmission rate (OTR) and a water vapor transmission rate (WVTR) can be reduced more than when the inorganic thin layer is formed only by using the base materials. In addition, when an inorganic composite is deposited, an organic layer is not damaged because of a low deposition temperature.

The inorganic thin layer is composed of an inorganic composite containing at least two kinds of inorganic materials.

The inorganic materials include all kinds of inorganic materials, and preferably include a metallic oxide or non-metallic oxide such as $SiO_2$, MgO, CaO, $Al_2O_3$, $TiO_2$, $ZrO_2$, $Ta_2O_5$ or $Na_yO_x$, a nitride such as $Si_3N_4$, and a salt such as $MgF_2$.

A mixing ratio of the inorganic composite can be determined in various ways according to a kind and number of mixed inorganic materials. For example, when two kinds of inorganic materials are mixed, the mixing ratio can be determined within the range of 1:1 to 1:30.

As compared with a thin layer composed of a mono-composition inorganic material, the inorganic thin layer composed of the inorganic composite shows a very low OTR and WVTR. Therefore, the inorganic thin layer can be used as a passivation layer of the organic electroluminescence device and a barrier layer to moisture and oxygen.

The inorganic thin layer can be varied in thickness upon the using purposes. Generally, the thickness of the inorganic thin layer ranges from 10 nm to 10 cm. When the thickness of the inorganic thin layer is smaller than 10 nm, penetration of moisture and oxygen cannot be completely prevented, and when the thickness of the inorganic thin layer is larger than 10 cm, applications thereof are restricted.

The inorganic thin layer is an inorganic mono-layer composed of one inorganic composite, or an inorganic multi-layer formed by stacking inorganic thin layers composed of at least two inorganic composites different in kind and/or number of mixed inorganic materials.

The present invention provides an organic electroluminescence device including the inorganic thin layer as a passivation layer.

The organic electroluminescence device includes a substrate, an anode electrode, an organic layer (comprised of a hole injection layer, a hole transfer layer, a light emitting layer and an electron transfer layer), a cathode electrode and an inorganic thin layer passivation layer.

The organic electroluminescence device can be a passive matrix organic electroluminescence device including a substrate, an anode electrode, cathode separators, an organic layer (comprised of a hole injection layer, a hole transfer layer, a light emitting layer and an electron transfer layer), a cathode electrode and the inorganic thin layer passivation layer.

The organic electroluminescence device can also be a top-emission type active matrix organic electroluminescence device including a substrate, a TFT array, a cathode electrode, an electron transfer layer, a light emitting layer, a hole transfer layer, a hole injection layer, an anode electrode, and the inorganic thin layer passivation layer.

In addition, the organic electroluminescence device can be a bottom-emission type active matrix organic electroluminescence device including a substrate, a TFT array, a cathode electrode, an electron transfer layer, a light emitting layer, a hole transfer layer, a hole injection layer, an anode electrode, and the inorganic thin layer passivation layer.

The inorganic mono-layer or the inorganic multi-layer are barrier layers having barrier characteristics to moisture and oxygen, which can be applied to the top, the bottom or both the top and bottom of the substrate irresistible to moisture, oxygen or heat. For example, the inorganic mono-layer or the inorganic multi-layer are applied to the top, the bottom or both the top and bottom of a flexible substrate irresistible to moisture and heat such as plastic, for remarkably reducing the WVTR and the OTR.

A flexible display having a very low WVTR and OTR can be fabricated by forming an organic electroluminescence device preferably including the inorganic thin film as a passivation layer on the flexible substrate which the inorganic thin layer has been applied to.

The present invention also provides a fabrication method of an organic electroluminescence device having an inorganic thin film passivation layer, further including a step for forming the inorganic thin film passivation layer by depositing an inorganic composite containing at least two kinds of inorganic materials.

In general, a transition temperature $T_g$ of an organic material of the organic electroluminescence device ranges from 80 to 120° C. The organic material may be damaged over 120° C. Preferably, the inorganic thin film layer is formed by depositing the inorganic composite at a temperature below 120° C. so that physical properties of the inorganic thin film layer can be improved and the organic materials in the organic electroluminescence device can be protected.

When the inorganic thin film passivation layer is applied to the organic electroluminescence device, a vacuum level preferably ranges from about $1\times10^{-4}$ to $1\times10^{-7}$ Torr. The inorganic thin film layer passivation layer can be formed by using a vacuum evaporator, a thermal evaporator or an electron-beam evaporator.

In more detail, the fabrication method of the organic electroluminescence device includes a step for forming an inorganic mono-layer or multi-layer passivation layer, by forming an anode electrode on a substrate, depositing an organic layer comprised of a hole injection layer, a hole transfer layer, a light emitting layer and an electron transfer layer on the anode electrode, forming a cathode electrode on the organic layer, and depositing an inorganic composite containing at least two kinds of inorganic materials on the cathode electrode.

The fabrication method of the organic electroluminescence device includes a step for forming an inorganic mono-layer or multi-layer passivation layer, by forming an anode electrode on a substrate, forming cathode separators on the anode electrode, depositing an organic layer comprised of a hole injection layer, a hole transfer layer, a light emitting layer and an electron transfer layer on the anode electrode, forming a cathode electrode on the organic layer, and depositing an inorganic composite containing at least two kinds of inorganic materials on the cathode electrode.

In addition, the fabrication method of the organic electroluminescence device includes a step for forming an inorganic mono-layer or multi-layer passivation layer, by forming a TFT array on a substrate, forming an organic layer comprised of a light emitting layer, an electron injection layer, a hole transfer layer and a hole injection layer on the cathode electrode, forming an anode electrode on the organic layer, and depositing an inorganic composite containing at least two kinds of inorganic materials on the anode electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

An inorganic thin layer passivation layer, an organic electroluminescence device including the same, and a fabrication method thereof in accordance with the preferred embodiments of the present invention will now be described in detail with reference to the accompanying drawings. These drawings or embodiments are not intended to be limiting, but explaining the present invention.

Figure 1:
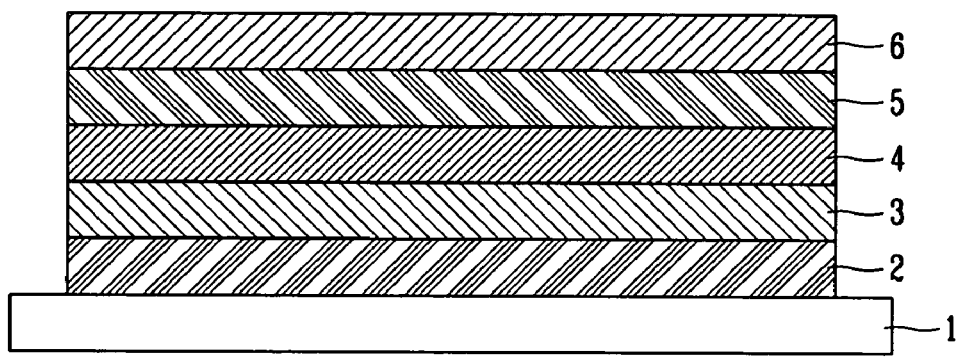
FIG. 1 is a cross-sectional diagram illustrating a general organic electroluminescence device.

FIG. 1 is a cross-sectional diagram illustrating a general organic electroluminescence device. An ITO is deposited on a glass or plastic substrate 1 by RF-sputtering, and patterned to form an anode electrode 2. An organic layer comprised of a hole injection layer 3, a hole transfer layer 4, a light emitting layer and an electron transfer layer 5 is deposited on the anode electrode 2. Here, thermal evaporation can be used. AlLi alloy having a low work function is deposited on the organic layer, to form a cathode electrode 6.

Figure 2:
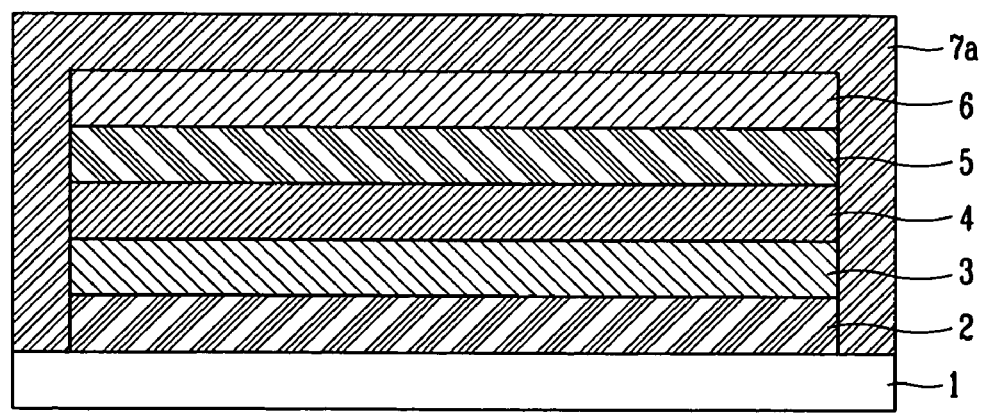
FIG. 2 is a cross-sectional diagram illustrating an organic electroluminescence device to which an inorganic mono-layer passivation layer has been applied in accordance with the present invention.

FIG. 2 is a cross-sectional diagram illustrating an organic electroluminescence device on which an inorganic mono-layer passivation layer 7a has been formed by depositing an inorganic composite thin layer. The inorganic mono-layer passivation layer 7a can be deposited by using an electron-beam evaporator. When deposited by using the electron-beam evaporator, the inorganic mono-layer passivation layer 7a is deposited thick because a deposition temperature of the multi-composition inorganic thin layer is relatively low. Moreover, the inorganic mono-layer passivation layer 7a is easily adhered to the organic electroluminescence device without cracks or pinholes.

In accordance with the preferred embodiment of the present invention, an SM composite inorganic thin layer, an SC composite inorganic thin layer or an SN composite inorganic thin layer can be formed as the inorganic mono-layer passivation layer 7a, by depositing an SM-composite containing $SiO_2$ and $MgO$, an SC-composite containing $SiO_2$ and $CaO$, or an SN-composite containing $SiO_2$ and $Na_yO_x$. For this, powdery $SiO_2$ and $MgO$ are mixed at a ratio of 1:1, 1:2 or 1:3, to obtain a pellet type SM-composite. In addition, powdery $SiO_2$ and $CaO$ are mixed at a ratio of 1:1, 2:1 or 3:1, to obtain a pellet type SC-composite. Powdery $SiO_2$ and $Na_yO_x$ are mixed at a ratio of 1:1, 2:1 or 3:1, to obtain a pellet type SN-composite.

In the same manner, various combinations of inorganic composites, such as an $MgO$ and $Na_yO_x$ composite, an $MgO$ and $Al_2O_3$ composite, an $MgO$, $SiO_2$ and $Al_2O_3$ composite, an $SiO_2$ and $Al_2O_3$ composite, an $SiO_2$ and $MgF_2$ composite and an $MgO$ and $MgF_2$ composite can be prepared in a pellet type.

The passivation layer 7a is formed on the surface of the organic electroluminescence device by depositing the pellet-type inorganic composite by the electron-beam evaporator. The deposition process can be easily performed and the organic layer 3, 4 and 5 can be protected, by lowering a working temperature of the inorganic composite below about 100° C.

Tables 1 and 2 show deposition conditions for the inorganic composite and a water vapor transmission rate (WVTR) of the synthesized inorganic thin layer. For comparison, Table 3 shows deposition conditions for a mono-composition inorganic material and a WVTR of a synthesized inorganic thin layer. In deposition of the inorganic composite and the mono-composition inorganic material, a deposition temperature is restricted below 80° C. to prevent damages of the organic layer.

TABLE 1

Deposition conditions for multi-composition inorganic material and WVTR

| Inorganic composite | Ratio | Thickness (nm) | Temperature (° C.) | WVTR (g/m² for day) |
|---|---|---|---|---|
| $SiO_2$:$MgO$ | 1:1 | 300 | 70 | 1.252 |
|  | 1:2 | 1,100 | 75 | 0.436 |
|  | 1:3 | 250 | 68 | 0.293 |
| $SiO_2$:$CaO$ | 4:5 | 150 | 53 | 3.591 |
|  | 2:1 | 1,300 | 63 | 0.820 |
|  | 3:1 | 1,000 | 63 | 1.823 |
| $SiO_2$:$Na_yO_x$ | 2:1 | 100 | 42 | 10.85 |
|  | 3:1 | 300 | 50 | 6.211 |

TABLE 2

| Inorganic composite | Ratio | Deposition temperature (° C.) | Deposition pressure (Torr) | Thickness (nm) | WVTR (g/m² for day) |
|---|---|---|---|---|---|
| $MgO$:$Na_yO_x$ | 2:1 | 60 | $2.8 \times 10^{-5}$ | 500 | 16.22 |
|  | 3:1 | 60 | $3.0 \times 10^{-5}$ | 600 | 8.407 |
| $MgO$:$Al_2O_3$ | 3:1 | 80 | $4.0 \times 10^{-5}$ | 180 | 3.990 |
|  | 4:1 | 80 | $4.0 \times 10^{-5}$ | 180 | 1.465 |
| $MgO$:$SiO_2$:$Al_2O_3$ | 15:5:2 | 90 | $1.0 \times 10^{-5}$ | 200 | 0.387 |
| $SiO_2$:$Al_2O_3$ | 4:1 | 74 | $4.0 \times 10^{-5}$ | 300 | 0.850 |
| $SiO_2$:$MgF_2$ | 2:1 | 43 | $5.0 \times 10^{-5}$ | 150 | 6.649 |
| $MgO$:$MgF_2$ | 2:1 | 40 | $2.2 \times 10^{-5}$ | 250 | 18.50 |

TABLE 3

Deposition conditions for mono-composition inorganic material and WVTR

| Inorganic material | Thickness (nm) | Deposition temperature (° C.) | WVTR (g/m² for day) |
|---|---|---|---|
| $CeO_2$ | 170 | 64 | 37.90 |
|  | 340 | 80 | 39.08 |
| $SiO_2$ | 1,000 | 80 | 33.97 |
|  | 500 | 52 | 34.08 |
| $MgF_2$ | 100 | 27 | 29.93 |
|  | 150 | 27 | 29.18 |
| $Al_2O_3$ | 10 | 80 | 36.77 |
| $TiO_2$ | 10 | 80 | 35.47 |
| $ZrO_2$ | 10 | 80 | 36.70 |
| $Ta_2O_5$ | 50 | 80 | 34.64 |

When the multi-composition inorganic composite (Table 1) is compared with the mono-composition inorganic material (Table 3), the inorganic thin layer composed of the multi-composition inorganic composite is deposited very thick in the consideration of the deposition temperature, and has a very low WVTR. That is, the inorganic thin layer composed of the multi-composition inorganic composite has excellent moisture proof. Accordingly, as compared with the inorganic thin layer composed of the mono-composition inorganic material, the inorganic thin layer composed of the multi-composition inorganic composite can remarkably reduce penetration of oxygen and moisture, and thus be efficiently used as a passivation layer of the organic electroluminescence device.

In addition, the inorganic thin layer of the invention has a very low oxygen transmission rate (OTR). Table 4 shows the OTR of a few inorganic thin layers in accordance with the present invention.

TABLE 4

| Inorganic composite | Ratio | Deposition temperature (° C.) | Deposition pressure (Torr) | Thickness (nm) | OTR (cc/m² for day) |
|---|---|---|---|---|---|
| $SiO_2$:MgO | 1:3 | 71 | $4.0 \times 10^{-5}$ | 400 | 0.334 |
| $SiO_2$:CaO | 3:1 | 57 | $4.0 \times 10^{-5}$ | 400 | 0.485 |
| MgO:$Na_yO_x$ | 3:1 | 67 | $4.0 \times 10^{-5}$ | 200 | 2.465 |
| $SiO_2$:$Na_yO_x$ | 3:1 | 50 | $4.0 \times 10^{-5}$ | 450 | 3.391 |
| $SiO_2$:$Al_2O_3$ | 4:1 | 76 | $4.0 \times 10^{-5}$ | 350 | 0.988 |
| MgO:$Al_2O_3$ | 3:1 | 80 | $6 \times 10^{-5}$ | 220 | 0.670 |

Figure 3:
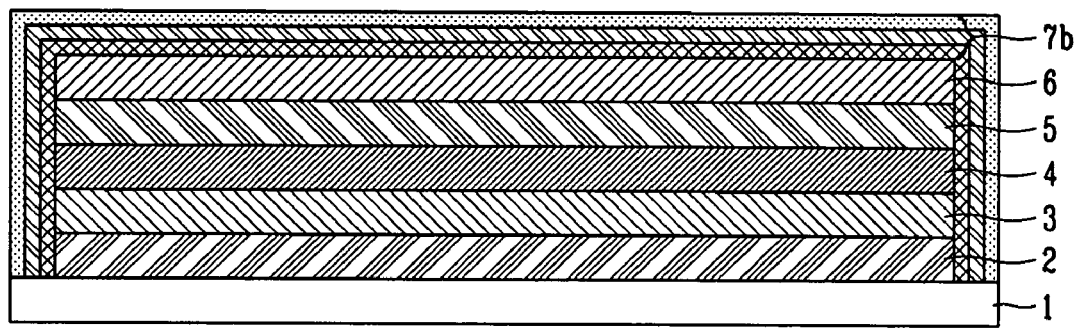
FIG. 3 is a cross-sectional diagram illustrating an organic electroluminescence device to which an inorganic multi-layer passivation layer has been applied in accordance with the present invention.

FIG. 3 is a cross-sectional diagram illustrating an organic electroluminescence device on which an inorganic multi-layer passivation layer 7b has been formed by depositing at least two layers of inorganic thin layers containing at least two kinds of composites. In accordance with the preferred embodiment of the present invention, the inorganic multi-layer passivation layer 7b can be formed by consecutively depositing at least two of an SM-composite containing $SiO_2$ and MgO, an SC-composite containing $SiO_2$ and CaO, and an SN-composite containing $SiO_2$ and $Na_yO_x$. The deposition process can be consecutively performed by using an electron-beam evaporator. For example, the inorganic multi-layer passivation layer 7b can be an SM-composite/SC-composite/SN-composite inorganic thin layer, an SM-composite/SC-composite/SM-composite inorganic thin layer, an SC-composite/SM-composite/SC-composite inorganic thin layer, an SN-composite/SM-composite/SC-composite inorganic thin layer, or an SM-composite/SC-composite/SM-composite/SM-composite inorganic thin layer.

Figure 4:
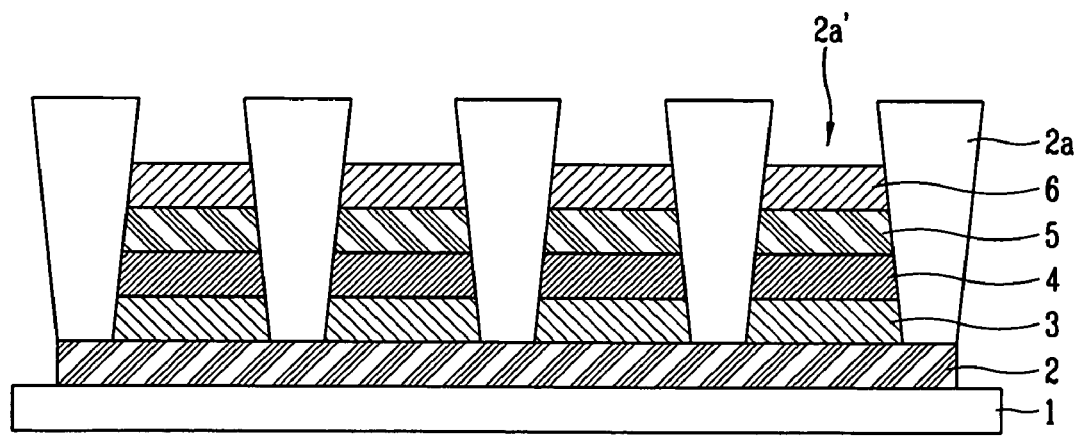
FIG. 4 is a cross-sectional diagram illustrating a passive matrix organic electroluminescence device.

FIG. 4 is a cross-sectional diagram illustrating a passive matrix organic electroluminescence device to which an inorganic thin layer passivation layer is not applied.

An ITO is deposited on a glass or plastic substrate 1 by RF-sputtering, and patterned to form an anode electrode 2. Cathode separators 2a are formed on the anode electrode 2 to cross the anode electrode patterns by using negative photoresist. An organic layer comprised of a hole injection layer 3, a hole transfer layer 4, a light emitting layer and an electron transfer layer 5 is deposited on the anode electrode 2 according to thermal evaporation. AlLi alloy having a low work function is deposited on the organic layer, to form a cathode electrode 6.

The cathode separators 2a are essential in the passive matrix organic electroluminescence device to prevent electric short from occurring by cathode lines of each pixel. As illustrated in FIG. 4, the cathode separators 2a are formed with a reverse taper angle to block the cathode lines between the adjacent pixels.

Preferably, a tilt and rotation technique for changing a substrate rotary speed and a tilt is used to completely coat even spaces 2a between the reverse taper angle cathode separators 2a with the multi-composition inorganic thin layer.

Figure 5:
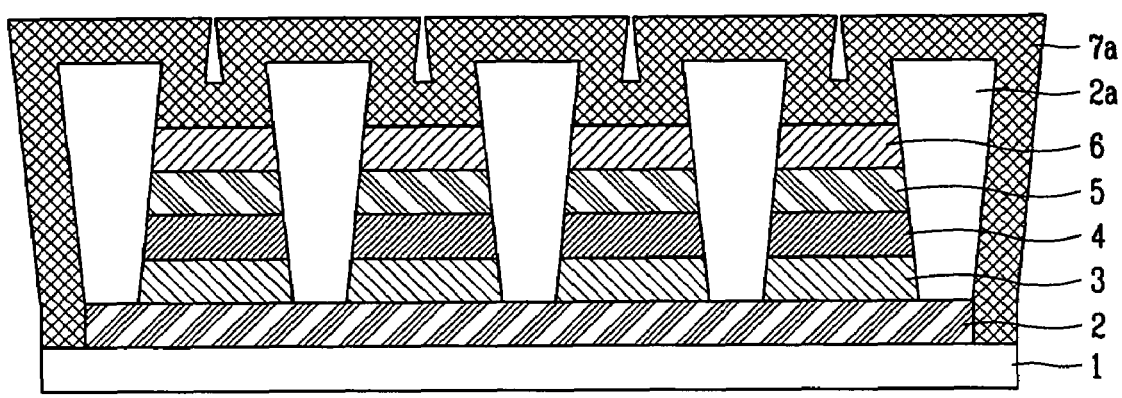
FIG. 5 is a cross-sectional diagram illustrating a passive matrix organic electroluminescence device to which an inorganic mono-layer passivation layer has been applied in accordance with the present invention.

FIG. 5 is a cross-sectional diagram illustrating a passive matrix organic electroluminescence device having cathode separators 2a on which an inorganic mono-layer passivation layer 7a has been formed. Here, an SM-composite, an SC-composite or an SN-composite can be used as an inorganic composite.

Figure 6:
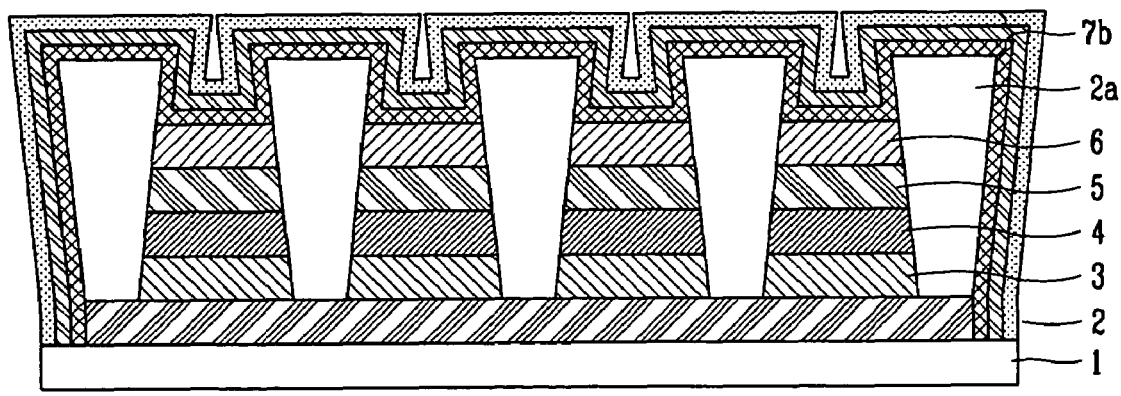
FIG. 6 is a cross-sectional diagram illustrating a passive matrix organic electroluminescence device to which an inorganic multi-layer passivation layer has been applied in accordance with the present invention.

In addition, an inorganic multi-layer passivation layer 7b can be formed by depositing inorganic thin layers containing at least two different kinds of composites on the passive matrix organic electroluminescence device of FIG. 4 according to a tilt and rotation technique (refer to FIG. 6). The inorganic multi-layer passivation layer 7b can be formed by consecutively depositing at least two of an SM-composite, an SC-composite and an SN-composite. Exemplary inorganic multi-layer passivation layers include an SM-composite/SC-composite/SN-composite inorganic thin layer, an SM-composite/SC-composite/SM-composite inorganic thin layer, an SC-composite/SM-composite/SC-composite inorganic thin layer, an SN-composite/SM-composite/SC-composite inorganic thin layer, and an SM-composite/SC-composite/SM-composite/SM-composite inorganic thin layer.

Figure 12A:
FIG. 12a is a scanning electron microscope (SEM) photograph showing a passive matrix organic electroluminescence device on which cathode separators have been formed.
Figure 12B:
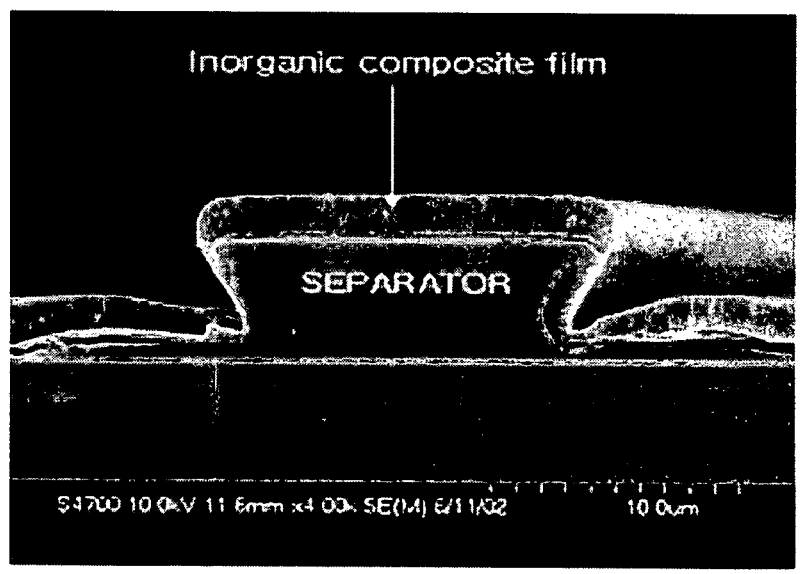
FIG. 12b is an SEM photograph showing a passive matrix organic electroluminescence device on which an inorganic composite thin layer has been deposited.

FIG. 12a is an SEM photograph showing cathode separators of a passive matrix organic electroluminescence device, and FIG. 12b is an SEM photograph showing an inorganic thin layer formed on spaces between the cathode separators.

Figure 7:
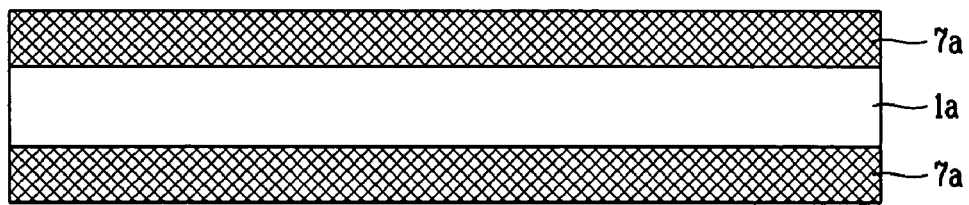
FIG. 7 is a cross-sectional diagram illustrating a structure of applying an inorganic mono-layer to a plastic substrate in accordance with the present invention.

In FIG. 7, an inorganic composite thin layer of the invention is used as a moisture and oxygen barrier layer of a substrate. FIG. 7 is a cross-sectional diagram illustrating a multi-composition inorganic mono-layer 7a formed on a plastic substrate 1a. The inorganic mono-layer 7a having barrier characteristics can be formed by depositing an SM-composite, an SC-composite or an SN-composite.

Figure 8:
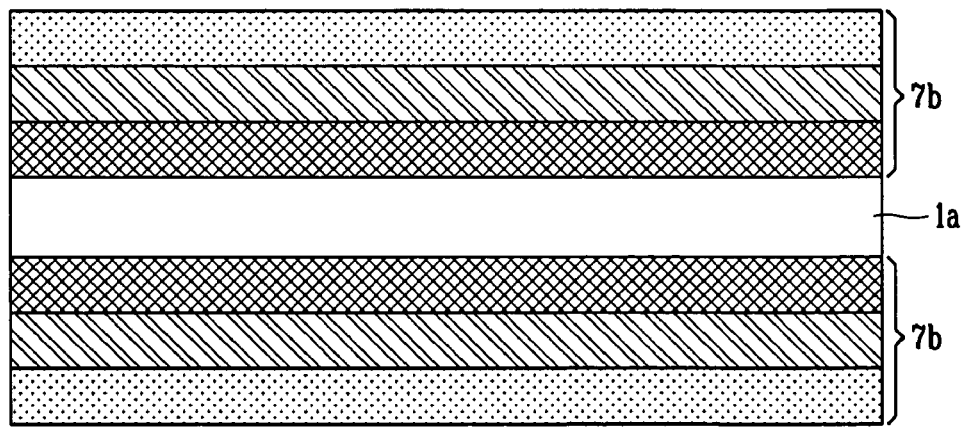
FIG. 8 is a cross-sectional diagram illustrating a structure of applying an inorganic multi-layer to a plastic substrate in accordance with the present invention.

In FIG. 8, an inorganic composite thin layer of the invention is also used as a moisture and oxygen barrier layer of a substrate. FIG. 8 is a cross-sectional diagram illustrating an inorganic multi-layer 7b formed on a plastic substrate 1a by consecutively depositing inorganic thin layers containing two different kinds of composites. The inorganic multi-layer 7b having barrier characteristics can be formed by consecutively depositing at least two of an SM-composite, an SC-composite and an SN-composite. For example, the inorganic multi-layer can be an SM-composite/SC-composite/SN-composite inorganic thin layer, an SM-composite/SC-composite/SM-composite inorganic thin layer, an SC-composite/SM-composite/SC-composite inorganic thin layer, an SN-composite/SM-composite/SC-composite inorganic thin layer, and an SM-composite/SC-composite/SM-composite/SM-composite inorganic thin layer.

Figure 9:
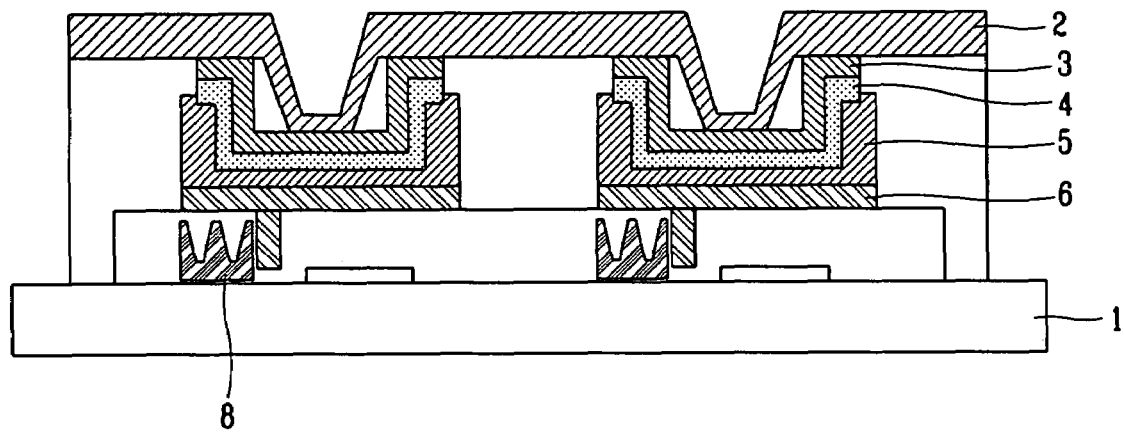
FIG. 9 is a cross-sectional diagram illustrating an active matrix organic electroluminescence device.

FIG. 9 is a cross-sectional diagram illustrating a bottom-emission type active matrix organic electroluminescence device. A TFT array 8 is formed on a glass or plastic substrate 1, and a cathode electrode 6 is formed thereon. An organic layer comprised of a light emitting layer, an electron injection layer 5, a hole transfer layer 4 and a hole injection layer 3 is formed on the cathode electrode 6 according to thermal evaporation. Thereafter, an anode electrode 2 is formed on the organic layer.

Figure 10:
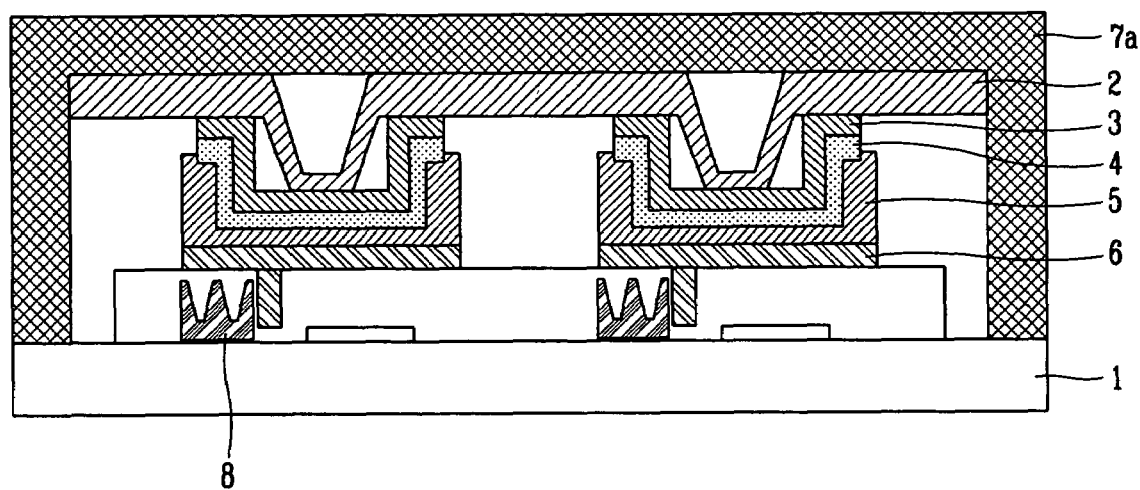
FIG. 10 is a cross-sectional diagram illustrating an active matrix organic electroluminescence device to which an inorganic mono-layer passivation layer has been applied in accordance with the present invention.

As shown in FIG. 10, an inorganic mono-layer passivation layer 7a can be formed by depositing a multi-composition inorganic thin layer on the active matrix organic electroluminescence device of FIG. 9. The inorganic mono-layer passivation layer 7a for the active matrix organic electroluminescence device can be formed by depositing an SM-composite, an SC-composite or an SN-composite.

Figure 11:
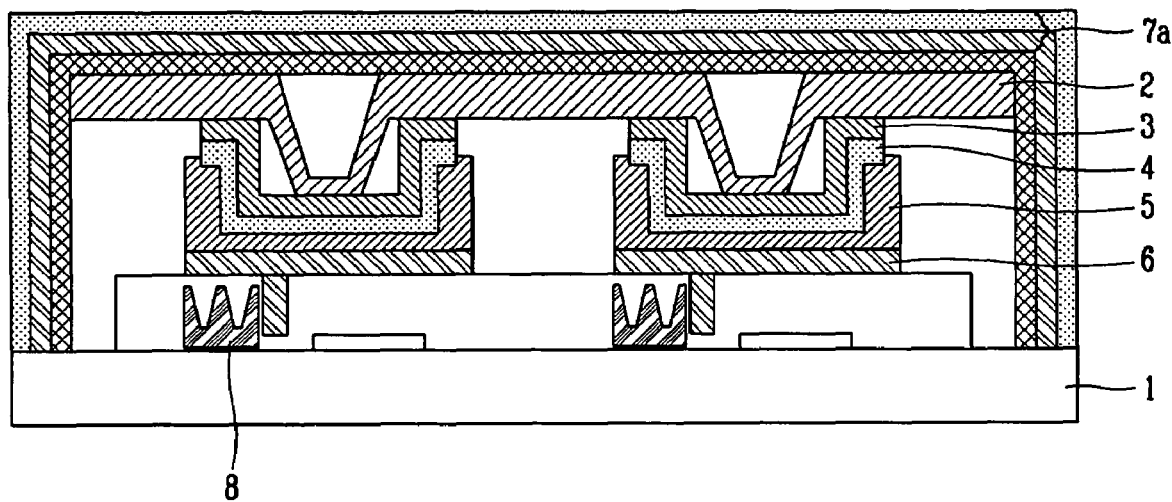
FIG. 11 is a cross-sectional diagram illustrating an active matrix organic electroluminescence device to which an inorganic multi-layer passivation layer has been applied in accordance with the present invention.

As depicted in FIG. 11, an inorganic multi-layer passivation layer 7b can be formed by consecutively depositing inorganic thin layers containing at least two different kinds of composites on the active matrix organic electroluminescence device. The inorganic multi-layer passivation layer 7b for the active matrix organic electroluminescence device can be formed by consecutively depositing at least two of an SM-composite, an SC-composite and an SN-composite. Exemplary inorganic multi-layer passivation layers include an SM-composite/SC-composite/SN-composite inorganic thin layer, an SM-composite/SC-composite/SM-composite inorganic thin layer, an SC-composite/SM-composite/SC-composite inorganic thin layer, an SN-composite/SM-composite/SC-composite inorganic thin layer, and an SM-composite/SC-composite/SM-composite inorganic thin layer.

Figure 13:
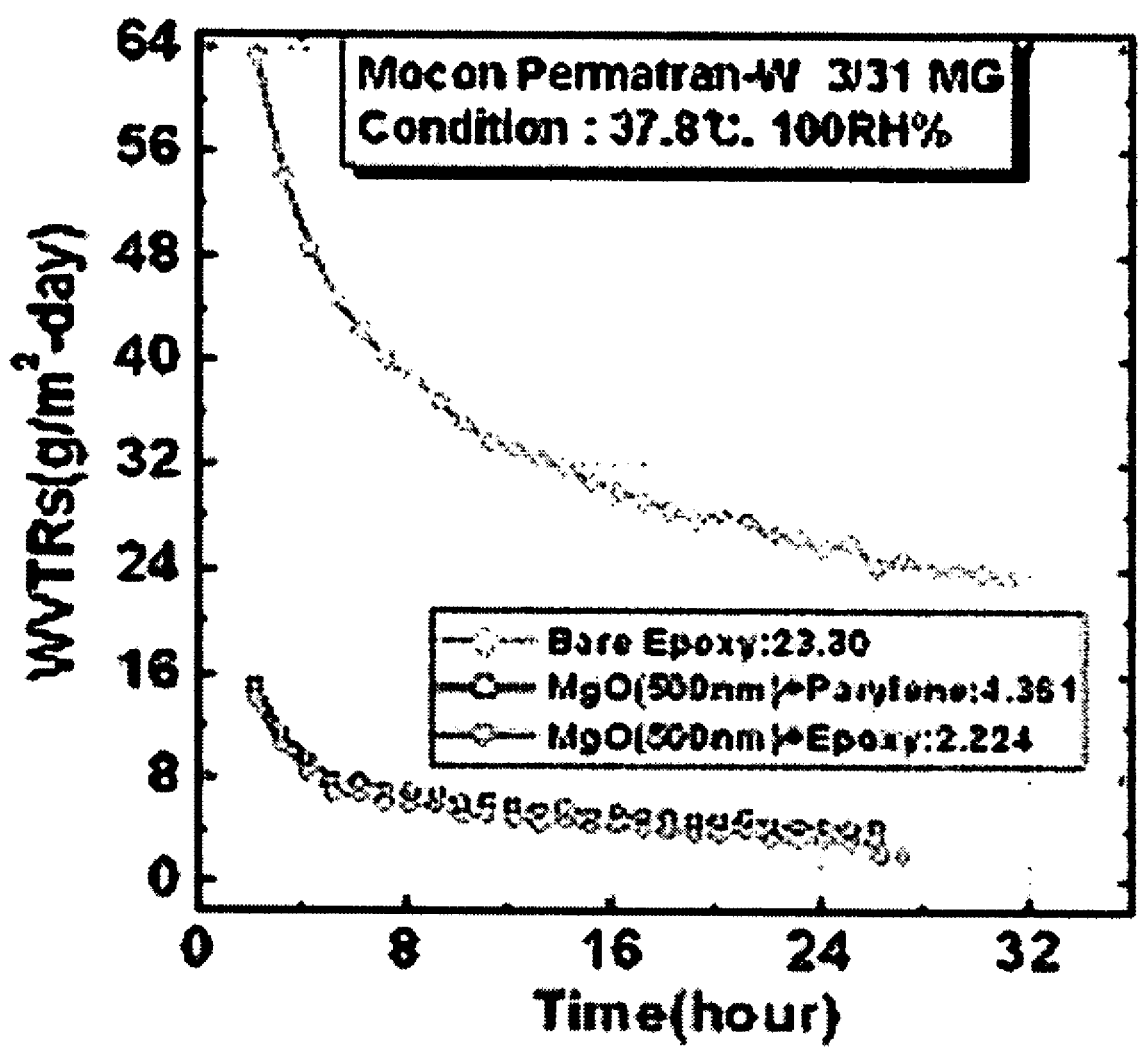
FIG. 13 a graph showing the permeation property of mixed thin layers in accordance with another embodiment of the present invention.

FIG. 13 shows the permeation property of mixed thin layers on a substrate in accordance with another embodiment of the present invention. The mixed layers consisted of an inorganic layer and an organic layer. MgO was used as an inorganic layer, and parylene or epoxy was used as an organic layer. Parylene can be formed on the inorganic layer by spin coating or chemical vapor deposition. Epoxy can be formed on the inorganic layer by dispensing.

Both MgO and parylene layers and MgO and epoxy layers show similar permeation property to that of single layer of MgO. On the contrary, single layer of epoxy shows high permeation rate. Thus, the property of commercially used organic layer can be enhanced by mixing an inorganic layer.

As discussed earlier, in accordance with the present invention, the inorganic thin layer is used as the passivation layer of the organic electroluminescence device, for protecting the organic layer from ambient oxygen and moisture, improving performance of the organic electroluminescence device, and increasing longevity thereof. Furthermore, the inorganic thin layer is applied to the plastic substrate irresistible to moisture and oxygen, and operated as the passivation layer having barrier characteristics to moisture and oxygen. In addition, the flexible substrate having the inorganic thin layer passivation layer can be applied to the flexible display.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An inorganic thin layer which comprises an inorganic composite containing at least two different inorganic materials each of which is individually selected from the group consisting of metallic oxide, non-metallic oxide, nitride and salt, and which has improved moisture and oxygen proof.

2. The inorganic thin layer of claim 1, wherein the metallic or non-metallic oxide comprises $SiO_2$, $MgO$, $CaO$, $Al_2O_3$, $TiO_2$, $ZrO_2$, $Ta_2O_5$ and $Na_yO_x$, the nitride comprises $Si_3N_4$, and the salt comprises $MgF_2$.

3. The inorganic thin layer of claim 1, which has a thickness ranging from 10 nm to 10 cm.

4. The inorganic thin layer of claim 1, which is an inorganic mono-layer composed of one inorganic composite.

5. The inorganic thin layer of claim 1, which is an inorganic multi-layer comprising stacked inorganic thin layers of which at least two different in kind, number or kind and number of mixed inorganic materials.

6. The inorganic thin layer of claim 1, further comprising an organic layer thereon.

7. An organic electroluminescence device, comprising:
a substrate; an anode electrode layer formed on the substrate; an organic layer comprised of a hole injection layer, a hole transfer layer, a light emitting layer and an electron transfer layer, and formed on the anode electrode layer;
a cathode electrode formed on the organic layer; and a passivation layer for covering the cathode electrode, wherein the passivation layer comprises an inorganic composite containing at least two different inorganic materials each of which is individually selected from the group consisting of metallic oxide, non-metallic oxide, nitride and salt.

8. The device of claim 7, wherein said device is a passive matrix organic electroluminescence device further comprising a plurality of cathode separators formed to cross the anode electrode layer.

9. The device of claim 7, wherein said device is an active matrix organic electroluminescence device further comprising a thin film transistor array formed on the substrate.

* * * * *